(12) United States Patent
Weichmann et al.

(10) Patent No.: US 10,361,531 B2
(45) Date of Patent: Jul. 23, 2019

(54) LIGHT EMITTING SEMICONDUCTOR DEVICES WITH GETTER LAYER

(71) Applicant: PHILIPS PHOTONICS GMBH, Ulm (DE)

(72) Inventors: Ulrich Weichmann, Aachen (DE); Andreas Peter Engelhardt, Aachen (DE); Johanna Sophie Kolb, Aachen (DE); Marcel Franz Christian Schemmann, Maria Hoop (NL); Holger Moench, Vaals (NL)

(73) Assignee: PHILIPS PHOTONICS GMBH, Ulm (DE)

( * ) Notice: Subject to any disclaimer, the term of this patent is extended or adjusted under 35 U.S.C. 154(b) by 0 days.

(21) Appl. No.: 15/119,502

(22) PCT Filed: Feb. 20, 2015

(86) PCT No.: PCT/EP2015/053606
§ 371 (c)(1),
(2) Date: Aug. 17, 2016

(87) PCT Pub. No.: WO2015/128254
PCT Pub. Date: Sep. 3, 2015

(65) Prior Publication Data
US 2017/0063031 A1    Mar. 2, 2017

(30) Foreign Application Priority Data
Feb. 25, 2014  (EP) ..................... 14156494

(51) Int. Cl.
*H01S 5/00* (2006.01)
*H01L 33/10* (2010.01)
(Continued)

(52) U.S. Cl.
CPC ...... *H01S 5/02204* (2013.01); *H01L 33/0062* (2013.01); *H01L 33/025* (2013.01);
(Continued)

(58) Field of Classification Search
CPC ... H01L 33/105; H01L 21/02; H01S 5/18361; H01S 5/305; H01S 5/02204;
(Continued)

(56) References Cited

U.S. PATENT DOCUMENTS 4,563,368 A * 1/1986 Tihanyi ............... C23C 30/00
                                                148/DIG. 60
4,656,638 A * 4/1987 Tihanyi ............... C23C 30/00
                                                372/49.01
(Continued)

FOREIGN PATENT DOCUMENTS

EP    0905835 A1    3/1999
JP    S63276215 A   11/1988
(Continued)

OTHER PUBLICATIONS

Chand N et al: "Variation of Background Impurities in AlxGa1-xAs (0.3=<chi=<0.4) with Growth Temperature: Implications for Device Leakage Current and Surface/Heterointerface Roughness", Journal of Crystal Growth, Elsevier, Amsterdam, NL, vol. III, No. 1-4, May 2, 1991 (May 2, 1991),pp. 20-25, XP024501854.

*Primary Examiner* — Tuan N Nguyen
(74) *Attorney, Agent, or Firm* — Leydig, Voit & Mayer, Ltd.

(57) ABSTRACT

The invention describes a light emitting semiconductor device (100) comprising a substrate (120), a light emitting layer structure (155) and an AlGaAs getter layer (190) for reducing an impurity in the light emitting layer structure (155), the light emitting layer structure (155) comprising an active layer (140) and layers of varying Aluminum content,
(Continued)

wherein the growth conditions of the layers of the light emitting layer structure (155) comprising Aluminum are different in comparison to the growth conditions of the AlGaAs getter layer (190). The AlGaAs getter layer (190) enables a reduction of the concentration of impurities like Sulfur etc. in the gas phase of a deposition equipment or growth reactor. The reduction of such impurities reduces the probability of incorporation of the impurities in the light emitting layer structure (155) which may affect the lifetime of the light emitting semiconductor device (100). The growth conditions are chosen out of the group Arsenic partial pressure, Oxygen partial pressure, deposition temperature, total deposition pressure and deposition rate of Aluminum. The invention further relates to a corresponding method of manufacturing such a light emitting semiconductor device (100).

17 Claims, 6 Drawing Sheets

(51) Int. Cl.
| | | |
|---|---|---|
| *H01S 5/183* | (2006.01) | |
| *H01S 5/343* | (2006.01) | |
| *H01L 21/00* | (2006.01) | |
| *H01L 21/265* | (2006.01) | |
| *H01S 5/30* | (2006.01) | |
| *H01L 33/00* | (2010.01) | |
| *H01L 33/02* | (2010.01) | |
| *H01L 33/30* | (2010.01) | |
| *H01S 5/022* | (2006.01) | |
| *H01S 5/042* | (2006.01) | |
| *H01L 33/12* | (2010.01) | |

(52) U.S. Cl.
CPC ............ *H01L 33/105* (2013.01); *H01L 33/30* (2013.01); *H01S 5/0425* (2013.01); *H01S 5/18308* (2013.01); *H01S 5/18361* (2013.01); *H01S 5/305* (2013.01); *H01L 33/12* (2013.01); *H01S 5/0014* (2013.01); *H01S 5/0021* (2013.01); *H01S 5/3432* (2013.01); *H01S 2301/173* (2013.01)

(58) Field of Classification Search
CPC .......... H01S 5/0021; H01S 5/022; H01S 5/30; H01S 5/323; H01S 3/085
USPC ........................................................ 438/27
See application file for complete search history.

(56) References Cited

U.S. PATENT DOCUMENTS

| | | | |
|---|---|---|---|
| 4,907,974 A * | 3/1990 | Gotoh | ............ H01L 21/02395 |
| | | | 117/89 |
| 5,038,356 A | 8/1991 | Botez | |
| 5,332,451 A | 7/1994 | Hata | |
| 5,342,805 A | 8/1994 | Chan | |
| 6,069,908 A | 5/2000 | Yuen | |
| 6,348,703 B1 | 2/2002 | Yoshinaga | |
| 6,447,604 B1 | 9/2002 | Flynn | |
| 6,466,148 B1 | 10/2002 | Wikner | |
| 7,208,770 B2 | 4/2007 | Kish | |
| 7,372,886 B2 | 5/2008 | Song et al. | |
| 8,101,498 B2 * | 1/2012 | Pinnington | ............ B82Y 20/00 |
| | | | 257/617 |
| 2002/0154675 A1 * | 10/2002 | Deng | ..................... B82Y 10/00 |
| | | | 372/96 |
| 2003/0179801 A1 * | 9/2003 | Takeuchi | ............ H01S 5/18313 |
| | | | 372/96 |
| 2003/0181024 A1 * | 9/2003 | Takeuchi | ............... C23C 16/301 |
| | | | 438/477 |
| 2003/0186805 A1 * | 10/2003 | Vanderspurt | ........... B01J 23/002 |
| | | | 502/304 |
| 2009/0273010 A1 | 11/2009 | Simoen | |
| 2010/0001361 A1 * | 1/2010 | Caplet | .................. B81B 7/0038 |
| | | | 257/467 |
| 2013/0109134 A1 | 5/2013 | Hatakenaka | |
| 2013/0137214 A1 * | 5/2013 | Bisotto | ................. H01L 21/425 |
| | | | 438/104 |

FOREIGN PATENT DOCUMENTS

| | | |
|---|---|---|
| JP | S63278395 A | 11/1988 |
| JP | H11238912 A | 8/1999 |
| JP | 2000312026 A | 11/2000 |
| JP | P2001339099 A | 12/2001 |
| JP | 2012174876 A | 9/2012 |

\* cited by examiner

LIGHT EMITTING SEMICONDUCTOR DEVICES WITH GETTER LAYER

FIELD OF THE INVENTION

The invention relates to light emitting semiconductor devices like Light Emitting Diodes (LED) or laser diodes as, for example, Vertical Cavity Surface Emitting Lasers (VCSEL) or edge emitting laser diodes. The invention further relates to a corresponding method of manufacturing such light emitting semiconductor devices.

BACKGROUND OF THE INVENTION

U.S. Pat. No. 6,447,604 B1 describes a III-V nitride homoepitaxial microelectronic device structure which may be used in UV-LEDs. A thin oxide layer is grown on a (Al,In,Ga)N substrate and subsequently stripped in an alkali solution or etched off in other suitable manner just before growth. The purpose of this thin oxide layer is to getter or remove potential impurities from the substrate, and allow the first few mono layers of the substrate surface to be free of homo-epitaxial layer interrupting impurities (such as C, Si, S or O) and/or other impurities.

There is a further need to reduce impurities during the growth process of light emitting semiconductor devices in order to increase lifetime and performance of the devices.

SUMMARY OF THE INVENTION

It's thus an object of the present invention to provide improved light emitting semiconductor devices and a corresponding method of manufacturing such light emitting semiconductor devices.

According to a first aspect a light emitting semiconductor device comprising a substrate, a light emitting layer structure and an AlGaAs getter layer for reducing an impurity in the light emitting layer structure is proposed. The light emitting layer structure comprises an active layer and layers of varying Aluminum content, wherein the growth conditions of the layers of the light emitting layer structure comprising Aluminum are different in comparison to the growth conditions of the AlGaAs getter layer such that a first concentration of the impurity within the AlGaAs getter layer is at least 50% higher in comparison to a second concentration of the impurity in the layers of the light emitting layer structure comprising Aluminum. The growth conditions are chosen out of the group Arsenic partial pressure, Oxygen partial pressure, deposition temperature, total deposition pressure and deposition rate of Aluminum. The deposition rate of Aluminum of the AlGaAs getter layer is chosen such that the AlGaAs getter layer comprises a sublayer in which an Aluminum content varies with less than 0.5%/nm between a first Aluminum content and a second Aluminum content different than the first Aluminum content.

Light emitting semiconductor devices comprise Light Emitting Diodes (LED) or laser diodes as, for example, Vertical Cavity Surface Emitting Lasers (VCSEL) or edge emitting laser diodes. The AlGaAs getter layer can be described by the structural formula $Al_xGa_{1-x}As$ wherein x describes the Aluminum content of the AlGaAs getter layer which may vary within the AlGaAs getter layer. The AlGaAs may comprise further elements in small quantities without affecting the efficacy of the getter layer. The Aluminum content may vary between $x1=0$ and $x2=1$ wherein common values are between $x1=0.05$ and $x2=0.9$. The full range between $x1=0$ and $x2=1$ can be used if the AlGaAs getter layer is deposited between the substrate and the light emitting layer structure such that absorption of photons and oxidation of, for example AlAs don't play a role. The impurities are enclosed within the AlGaAs getter layer such that the concentration of the impurities in the gas phase in the deposition equipment is reduced. Only one of the growth conditions may be different or a combination of two or more of the growth conditions out of the group Arsenic partial pressure, Oxygen partial pressure, deposition temperature, total deposition pressure and deposition rate of Aluminum may be different during deposition of the AlGaAs getter layer. It may, for example, be that the Arsenic partial pressure or the ratio between Arsenic partial pressure to Gallium partial pressure in the gas phase may be identical to the Arsenic partial pressure of a layer of a light emitting layer structure whereas the aluminum content of the AlGaAs getter layer determined by the Al deposition rate during deposition of the AlGaAs getter layer varies differently within the AlGaAs getter layer in comparison to the layers of the light emitting layer structure.

Alternatively, it may be that the Arsenic partial pressure may be controlled differently during deposition of the AlGaAs getter layer in comparison to deposition of the layers of the light emitting layer structure comprising Aluminum. This may comprise a different ratio of Arsenic partial pressure to Gallium partial pressure or a dynamic change of said ratio during deposition of the AlGaAs getter layer.

Dynamic variation or change of the different growth conditions during deposition of the AlGaAs getter layer may have the advantage that it's not necessary to exactly match certain conditions in order to reduce the concentration of an impurity. It may be sufficient to change the growth conditions during deposition of the AlGaAs getter layer that slow that the concentration in the gas phase of the deposition equipment is significantly reduced when the deposition conditions match the conditions to embed the impurity or impurities within the AlGaAs getter layer. Significantly means in this respect a reduction of at least 20%, preferably 50%, more preferably 90% of the respective impurity in the gas phase. It may also be that there are two or more AlGaAs getter layers wherein in first layer the Al deposition rate is changed, in a second layer the As partial pressure, in a third layer the temperature etc. The variations of growth conditions during deposition of the AlGaAs getter layer may also comprise oscillations of the growth conditions. The Al-content of the AlGaAs getter layer may, for example, increase from a first Al-content x1 to a second Al-content x2 and subsequently decrease to a third Al-content x3.

There are a number of impurities like S, P, O, Zn, Si, B, N, In etc. in the gas phase which may affect the lifetime of the light emitting semiconductor devices. Impurity means in this respect that the respective element is an unwanted addition to the gas phase of the deposition equipment or apparatus at one special deposition step. The wanted dopant at one deposition step may be an impurity in another deposition step.

Experiments have shown that especially Sulfur may dramatically decrease the lifetime of a light emitting semiconductor device. The AlGaAs getter layer may thus be adapted to incorporate Sulfur in order to reduce the Sulfur concentration in the gas phase of the deposition equipment.

The active layer which comprises the light emitting layers like the quantum well is most sensitive with respect to incorporation of impurities affecting the lifetime of the light emitting semiconductor device. The AlGaAs getter layer is thus preferably be arranged between the substrate and the active layer. One or more AlGaAs getter layers may be directly deposited on the substrate or may, for example, be embedded in case of VCSEL in the lower Dielectric Bragg Reflector (DBR) deposited prior to deposition of the active layer.

Experiments have shown that the deposition rate of Aluminum strongly influences the incorporation of impurities. The deposition rate of Aluminum of the AlGaAs getter layer is chosen such that an Aluminum content of the AlGaAs getter layer varies with less than 0.5%/nm. Experiments have further shown that a slow variation of the Al content within the AlGaAs getter layer may enable an improved reduction of impurities in the gas phase of the deposition equipment. The Aluminum content may be increased with a constant rate of 0.4%/nm or preferably even 0.3%/nm from a first Aluminum content x1 at a begin of the AlGaAs getter layer and a second Aluminum content x2 at an end of the AlGaAs getter layer. The aluminum content may alternatively be decreased. The lower Aluminum content x1 may be 0.1 or 0.2 and the upper second Aluminum content x2 may be 0.9. The second Aluminum content x2 may be preferably 0.6, 0.5 or 0.4. It may be advantageous that an AlGaAs getter layer comprises one or more sub layers with increasing and decreasing Aluminum content. Increasing and decreasing refers to the side of the AlGaAs getter layer which is next to the substrate. The latter may be advantageous if, for example, in dependence of other growth conditions the impurity may be preferably incorporated at an Al content between x1=0.2 and x2=0.4. It may be possible to incorporate most of the impurity or impurities within a relatively thin AlGaAs getter layer by subsequently varying the Al content between x1 and x2 at a rate of 0.3%/nm. Anyhow, it may also be possible that the AlGaAs getter layer comprises a region of constant Al content.

In addition the deposition rate of Aluminum of the layers of the light emitting layer structure comprising Aluminum may be chosen such that an Aluminum content of the layers of the light emitting layer structure comprising Aluminum varies with at least 0.5%/nm. Experiments have shown that a fast change of the Aluminum content reduces in contrast to a slow variation the probability to incorporate impurities within the layers of the light emitting layer structure. The latter helps to avoid incorporation of impurities in the sensitive region within and next to the active layer if the concentration of the impurity is below a threshold value. The fast change of the Al concentration in the region within and next to the active layer thus supports the effect of the AlGaAs getter layer which reduces the concentration of one or more impurities in the gas phase of the deposition equipment.

Alternative or in addition to the measures described above it may be advantageous that the Arsenic partial pressure during deposition of the AlGaAs getter layer may be varied in at least a part of a range between 2 and 200 times the Gallium partial pressure. The Arsenic partial pressure may be preferably varied during deposition of the AlGaAs getter layer in at least a part of a range between 5 and 80 times the Gallium partial pressure. The variation may be varied continuously by linearly changing the Arsenic partial pressure from, for example, 10 to 30 times the Gallium partial pressure or from 60 to 20 times the Gallium partial pressure. Alternatively or in addition the ratio between Arsenic and Gallium partial pressure may be changed step wise. Furthermore, it may be possible to provide an oscillating ratio between Arsenic and Gallium partial pressure (similarly as described above with respect to the Al content). An Oscillation of the ratio between Arsenic and Gallium partial pressure may enable relatively thin AlGaAs getter layers which are adapted to reduce the concentration of impurities in the gas phase of the deposition equipment. Changing the ratio between Arsenic and Gallium partial pressure does not necessarily change the overall crystal structure of the AlGaAs getter layer but the number of lattice defects may be changed such that the probability of incorporation of impurities within the AlGaAs getter layer may be changed.

Alternatively or in addition to the measures described above the Oxygen partial pressure during deposition of the AlGaAs getter layer may be increased such that a first concentration of the Oxygen within the AlGaAs getter layer is at least 50% higher in comparison to a second concentration of the Oxygen in the layers of the light emitting layer structure comprising Aluminum. Increasing the Oxygen partial pressure in the deposition equipment during deposition of the AlGaAs getter layer may increase incorporation of impurities within the AlGaAs getter layer. The increased oxygen partial pressure also increases the Oxygen content within the AlGaAs getter layer. Care has thus to be taken that the additional Oxygen does not cause damage in the layers of the light emitting layer structure. The Oxygen partial pressure is therefore chosen such that the Oxygen concentration within the AlGaAs getter layer is below $10^{18}$ cm$^{-3}$ more preferably below $2*10^{17}$ cm$^{-3}$. The Oxygen partial pressure may be changed continuously or step wise from a first to a second, third etc. partial pressure or even in an oscillating way as described with respect to the As partial pressure or the Al deposition rate above.

Alternatively or in addition to the measures described above the deposition temperature during deposition of the AlGaAs getter layer (190) may be varied in at least part of the range between 500° C. and 750° C. The temperature may be changed continuously or step wise from a first to a second, third etc. temperature or even in an oscillating way as described with respect to the As partial pressure, the Al deposition rate or the Oxygen partial pressure above. The temperature may be varied, for example, very quickly by heating a wafer with the layer structure of the light emitting semiconductor device and especially the surface where the material is deposited on by means of electromagnetic radiation. The electromagnetic radiation may be provided by semiconductor light sources enabling quick temperature changes. Quick temperature changes may enable deposition of the AlGaAs at non equilibrium condition which may be used to further increase the absorption capability of the AlGaAs getter layer and the probability of incorporation of impurities within the AlGaAs getter layer.

Alternatively or in addition to the measures described above the total pressure during deposition of the AlGaAs getter layer may be varied in at least part of the range between 50 mbar and 150 mbar. The total pressure may be changed continuously or step wise from a first to a second, third etc. pressure or even in an oscillating way as described with respect to the As partial pressure, the Al deposition rate, the Oxygen partial pressure or the temperature above.

The time needed to deposit the AlGaAs getter layer increases the total processing time but a minimum thickness is needed in order to efficiently reduce the concentration of impurities in the gas phase of the deposition equipment. The thickness of the AlGaAs getter layer may therefore be at least 50 nm. Depending on the deposition equipment it may be advantageous to provide an AlGaAs getter layer with a thickness of 100 nm, 200 nm, 300 nm or even up to 500 nm.

The light emitting semiconductor device may comprise a first, a second, third or even more AlGaAs getter layers, which may be deposited by different growth conditions such that preferentially different impurities are incorporated in the different AlGaAs getter layers. Each AlGaAs getter layer may incorporate all impurities but only one impurity may predominantly be incorporated. The getter layers may be stacked on one another. Alternatively or in addition it may be advantageous to add an AlGaAs getter layer to the light emitting semiconductor device after adding, for example, a dopant to a previously deposited layer. The AlGaAs getter layer may be adapted to reduce the concentration of the dopant (e.g. Si) in the gas phase because the dopant may be an impurity for subsequently deposited layers.

The light emitting semiconductor device may be a Vertical Cavity Surface Emitting Laser (VCSEL) comprising a first electrode and a second electrode, wherein the light emitting structure comprises a bottom DBR, the active layer and a top DBR, wherein an Aluminum content of the AlGaAs getter layer changes at least five times slower within the AlGaAs getter layer in comparison to a change of an Aluminum content of a layer of the bottom DBR or the top DBR. A relative slow change of the Aluminum content during deposition of the AlGaAs getter layer may increase the probability to reduce the concentration of one or more impurities in the gas phase. The change of the deposition rate may be 0.5%/nm, 0.4%/nm, 0.3%/nm or lower. Care has to be taken with respect to a graded (refractive) index layer (GRIN) which may be deposited near to the active layer of the VCSEL. The Al content of a GRIN varies much slower than the Al content of a layer of one of the DBR. The change of the deposition rate of Al within the GRIN may be higher than 0.5%/nm, 0.6%/nm, preferably higher than 0.7%/nm in order to avoid that the GRIN acts as an AlGaAs getter layer next to the active layer of the VCSEL as long as the concentration of the impurity or impurities in the gas phase exceed a threshold value.

According to a further aspect a method of manufacturing a light emitting semiconductor device is provided. The method comprises the steps of:
  providing a substrate;
  providing a light emitting layer structure at first growth conditions; and
  providing a AlGaAs getter layer for reducing impurities in the layer structure of the light emitting semiconductor device at second growth conditions different from the first growth conditions, wherein the second growth conditions are chosen such that a first concentration of the impurity within the AlGaAs getter layer is at least 50% higher in comparison to a second concentration of the impurity in the layers of the light emitting layer structure comprising Aluminum, and the first and the second growth conditions are chosen out of the group Arsenic partial pressure, Oxygen partial pressure, deposition temperature, total deposition pressure and deposition rate of Aluminum, wherein the deposition rate of Aluminum of the AlGaAs getter layer (190) is chosen such that the AlGaAs getter layer (190) comprises a sublayer in which an Aluminum content varies with less than 0.5%/nm between a first Aluminum content and a second Aluminum content different than the first Aluminum content.

The step of providing the AlGaAs getter layer may happen prior to deposition of the light emitting layer structure. Alternatively or in addition may the AlGaAs getter layer may be provided or deposited after providing a part of the light emitting layer structure.

It shall be understood that a preferred embodiment of the invention can also be any combination of the dependent claims with the respective independent claim. Furthermore the method of manufacturing may comprise embodiments corresponding to the embodiment of the light emitting semiconductor device as described by the dependent claims and the description of the respective embodiments.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings:

FIG. 1 shows a light emitting semiconductor device according to a first embodiment.

FIG. 2 shows a light emitting semiconductor device according to a second embodiment.

FIG. 3 shows an Al-profile of a prior art VCSEL-structure.

FIG. 4 shows an Al- and Sulfur-profile of a prior art VCSEL-structure.

FIG. 5 shows an enlarged view of the profile shown in FIG. 4.

FIG. 6 shows an Al- and Sulfur-profile of a VCSEL-structure with changed growth conditions in comparison to the profile shown in FIG. 4.

FIG. 7 shows an Al-profile of a first light emitting semiconductor device in accordance with the present invention.

FIG. 8 shows an Al-profile of a second light emitting semiconductor device in accordance with the present invention.

FIG. 9 shows an Al-, S- and O-profile of a light emitting semiconductor device with varying Oxygen partial pressure during deposition of the layers of the light emitting semiconductor device.

FIG. 10 shows a principal sketch of the method according to the present invention.

FIG. 11 shows the effect of reducing the S concentration in the light emitting layer structure of the light emitting semiconductor device.

In the Figures, like numbers refer to like objects throughout. Objects in the Figures are not necessarily drawn to scale.

DETAILED DESCRIPTION OF EMBODIMENTS

Various embodiments of the invention will now be described by means of the Figures.

Figure 1:
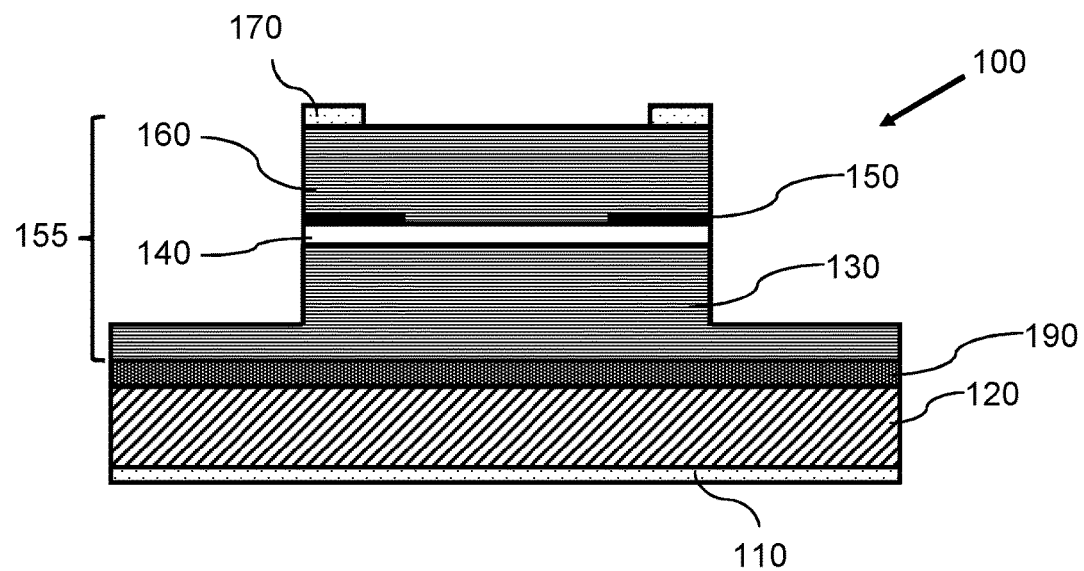

FIG. 1 shows a light emitting semiconductor device 100 according to a first embodiment. The light emitting semiconductor device 100 is a VCSEL and comprises a first electrode 110 provided on a first side of a GaAs substrate 120, a AlGaAs getter layer 190 provided on a second side of the GaAs substrate 120, a light emitting layer structure 155 and second electrode 170. The light emitting layer structure comprises a bottom DBR 130 with a reflectivity of preferably more than 99% provided on top of the AlGaAs getter layer 190, an active layer 140, a confinement layer 150 and a top DBR 160 provided underneath of the second electrode 170. The top DBR has a reflectivity of preferably more than 95% enabling laser emission via the top DBR 160. The active layer 140 comprises the quantum well which emits laser light if electrical power is provided via the first electrode 110 and the second electrode 170. The laser light is emitted via the top DBR 160 passing the ring shaped second electrode 170.

Figure 2:
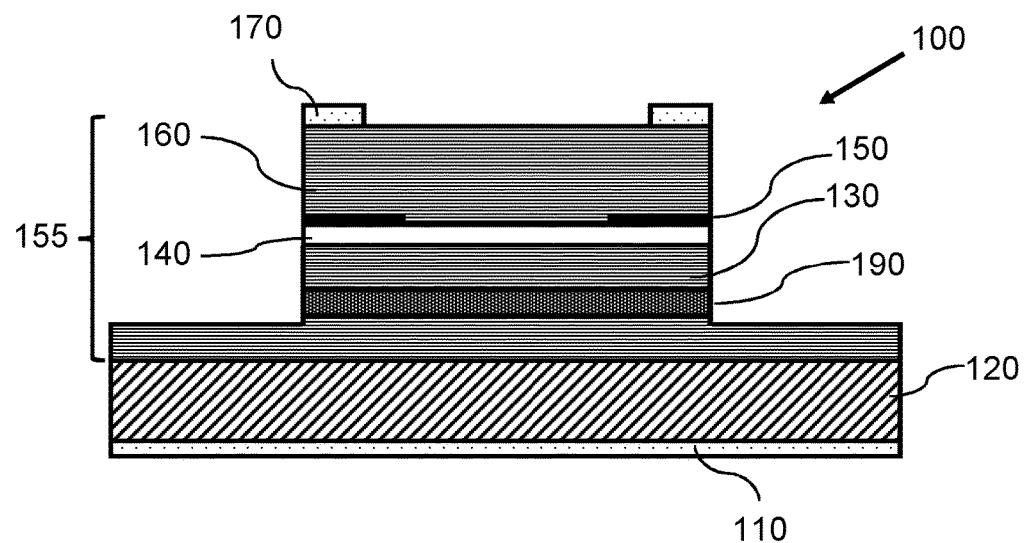

The AlGaAs getter layer 190 can also be arranged within the bottom DBR 130 as shown in the second embodiment of a light emitting semiconductor device 100 according to the present invention depicted in FIG. 2. It may also be possible to provide several AlGaAs getter layers 190. One or more of the AlGaAs getter layers 190 may be provided on the substrate and one or more other AlGaAs getter layers 190 may be provided between the first layer of the bottom DBR 130 and the last layer of the top DBR 160.

Figure 3:
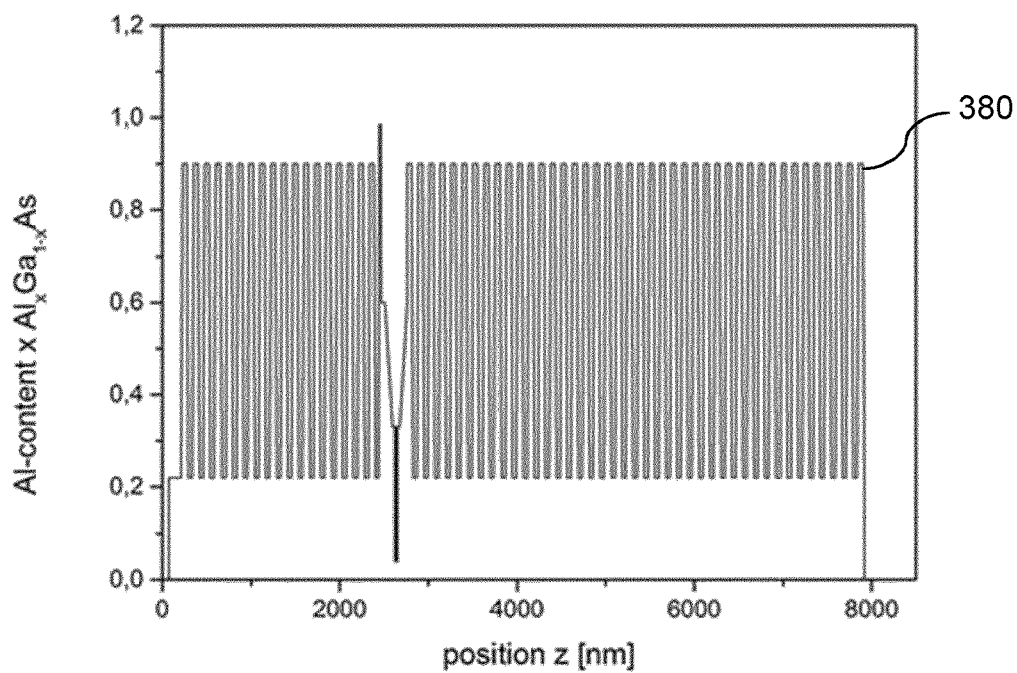

FIG. 3 shows an Al-profile 380 of a prior art VCSEL-structure. The epitaxial growth starts on the substrate 120, which is at a position of about 8000 nm in FIG. 3. The first part of the VCSEL is the bottom DBR 130, which extends to about a position of 3000 nm, followed by the active layer 140, which is formed of a graded index layer (GRIN), a cavity spacer, the quantum wells and the barriers in-between. At a position slightly above 2500 nm, the highest Al-level in the structure indicates the position of the oxide-aperture building the confinement layer 150, followed by the top DBR 160, which has less mirror pairs than the bottom DBR 130, since it transmits a portion of the light as laser emission. The last two parts of the VCSEL at positions close to 0 nm in FIG. 3 are the sub-cap- and cap-layers, which are needed to form an electrical contact and to match the reflectivity taking into account the refractive index jump between semiconductor material and air. To increase the electrical conductivity of the material, dopants have to be used. Typically, as a p-dopant Carbon and as a n-dopant Si is used, however, there is a variety of other elements known in the literature that were successfully used as dopants: Sn, S, Se, Te, Zn, Be, Mg . . . . Besides these materials, also Oxygen and Hydrogen are usually present in a reactor and incorporated in the epitaxial structure. There are further substances, which are for example used for cleaning of substrates or parts of the deposition equipment or reactor or are present in the gasses. All these substances may be useful in one processing step but may be impurities affecting the performance of the light emitting semiconductor at a subsequent processing step. Depending on the mechanism, the electrical conductivity could increase, the electro-optical efficiency could deteriorate or the lifetime of the devices could be shortened. It is therefore highly desired to reduce the amount of impurities in the epitaxial structure.

Figure 4:
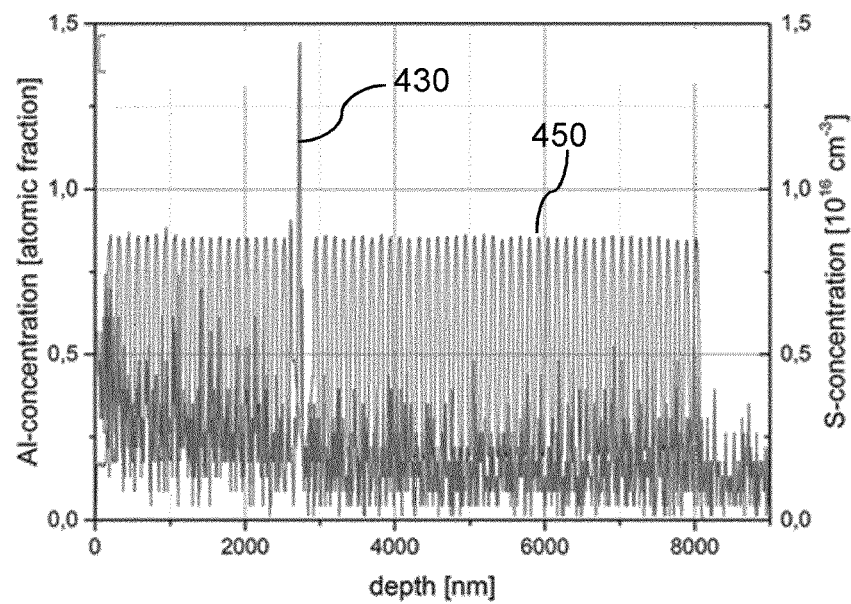
Figure 5:
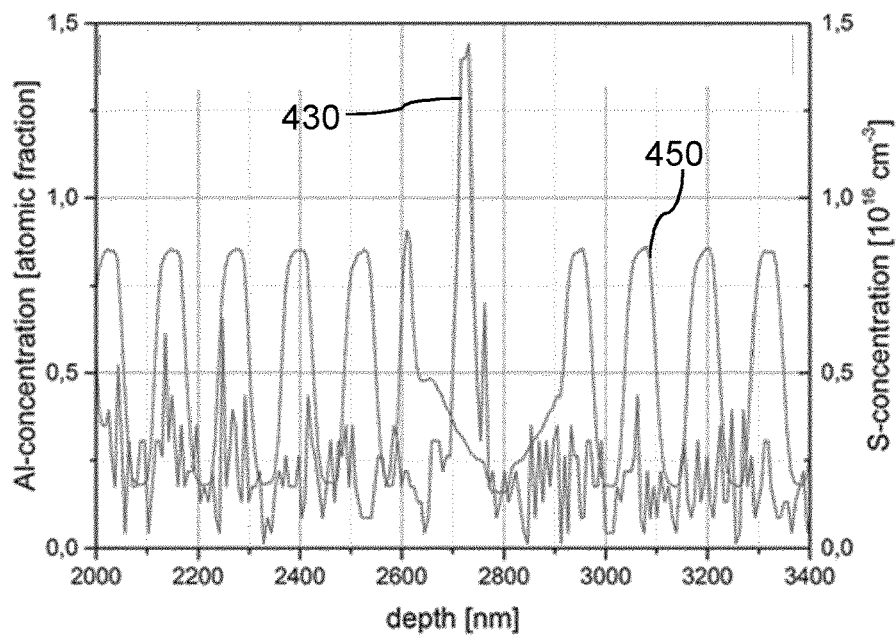
Figure 11:
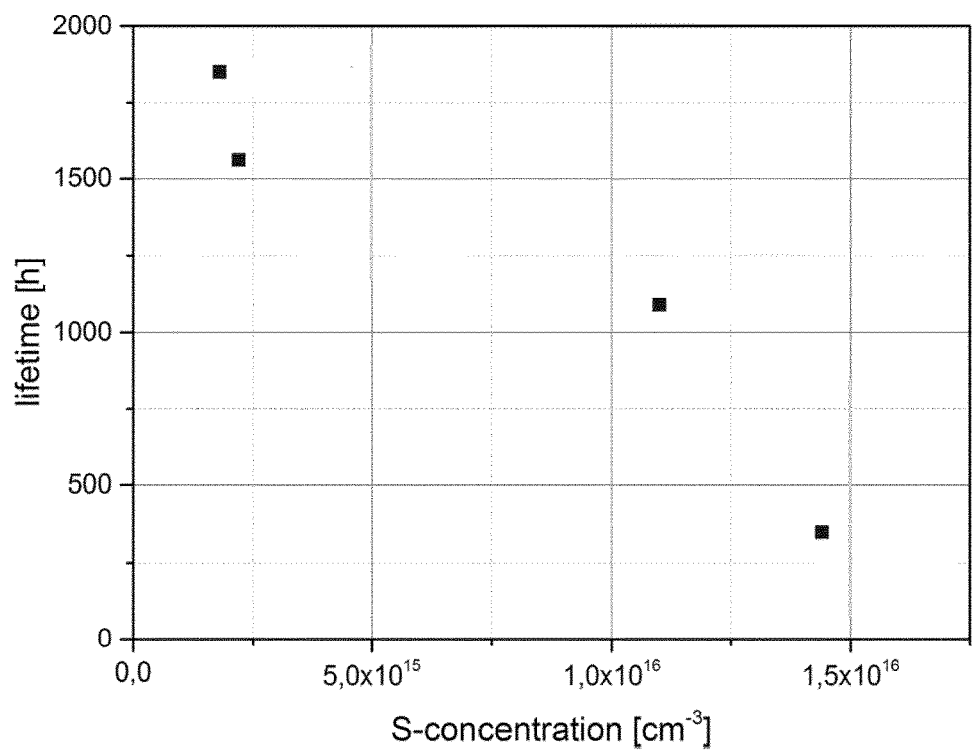

FIG. 4 shows SIMS-spectra of the Aluminum-content in the structure and the concentration of an impurity, which is Sulfur (S) in this case. The impurity is mostly incorporated at a position within the GRIN of the Al-profile 450 between 2800 nm and 2600 nm as shown by the peak in the Sulfur profile 430. A smaller range of these spectra is shown in FIG. 5. Clearly, the impurity is incorporated in a region of slowly varying Al content. The deposition rate of Al was controlled during deposition of the GRIN in a way that the Al content changes with 0.31%/nm. Sulfur is embedded in the GRIN with increasing Al content between 2800 nm and 2600 nm. The ratio between the As partial pressure and Ga partial pressure between 2800 nm and 2600 nm of the active layer was lowered in order to enable p-doping of the GRIN by means of Carbon (C), wherein in the range between 2800 nm and 3400 nm the ratio between the As partial pressure and Ga partial pressure was chosen such that incorporation of Carbon was avoided. The S concentration has a clear peak starting at an Al content of around x1=0.25 and ending at an Al content of around x2=0.4. The incorporation of Sulfur may be supported by the lower As partial pressure in relation to the Ga partial pressure which may increase the number of lattice defects in the GRIN in which the Sulfur may be trapped. FIG. 11 shows accelerated lifetime experiments at 170° C. and a driving current of 6 mA performed with such a standard VCSEL. VCSELs with such high sulfur content have a low lifetime of less than 400 hours.

Figure 6:
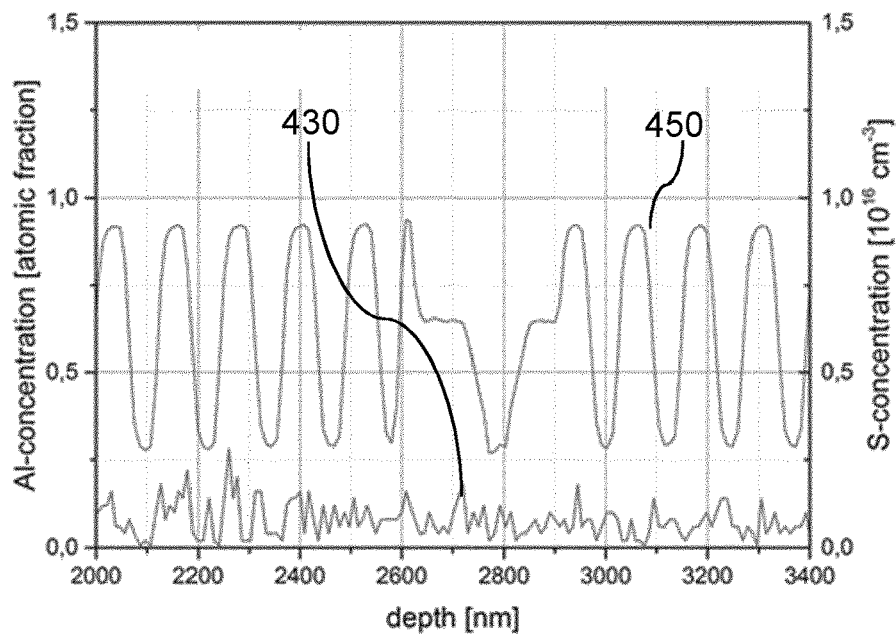

FIG. 6 shows an Aluminum-profile 450 and a Sulfur-profile 430 of a modified VCSEL-structure in comparison to the profile shown in FIG. 4. In contrast to FIGS. 4 and 5 shows the SIMS-spectra a lower S-content and a different structure. This may be caused by the fact that the Sulfur concentration is much lower than the Sulfur concentration in the structure shown in FIGS. 4 and 5. In addition it is avoided that the GRIN layer acts as AlGaAs getter layer which preferably absorbs Sulfur by varying the Al-content much faster in the GRIN-region. Essentially no Sulfur is found in this region. Experiments have shown that it is essential to reduce the concentration of in this case Sulfur below a defined threshold value which may be in the range of $1*10^{15}$ $cm^3$ in order to avoid fast degradation of the light emitting semiconductor device. The AlGaAs getter layer 190 may thus be used to incorporate possible impurities that are present in the reactor in order to decrease the impurity concentration in the gas phase below a threshold value in order to enable low Sulfur concentrations in the light emitting layer structure and especially in and next to the active layer. In addition any AlGaAs getter layer 190 should be avoided next to the sensitive active layer 140. The AlGaAs getter layer 190 is thus preferably deposited between the substrate 120 and the light emitting layer structure or within the lower half of the bottom DBR 130 next to the substrate 120.

Figure 7:
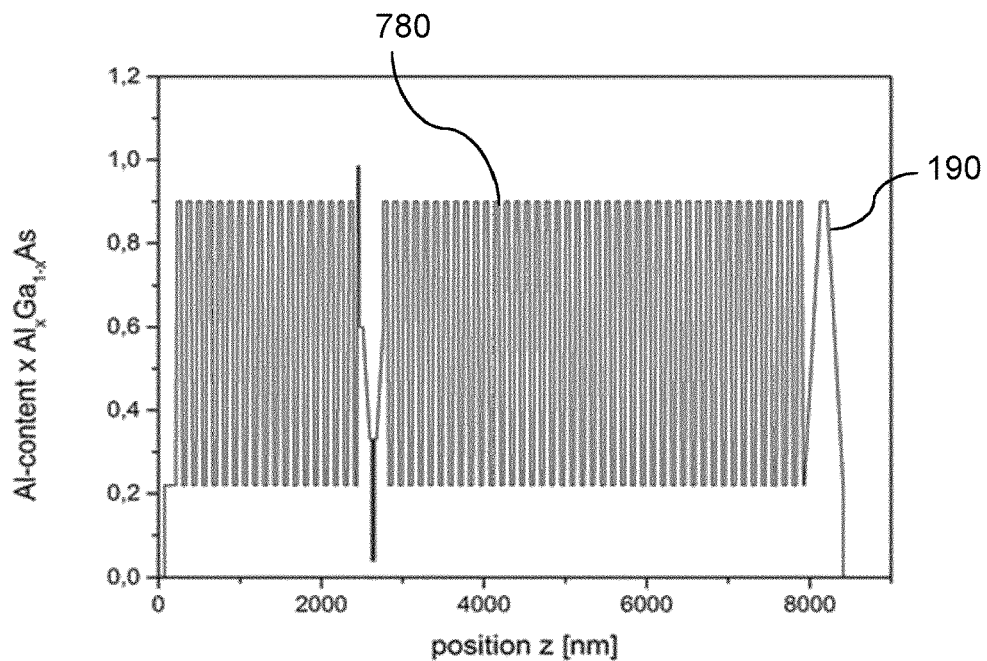

One example of such a structure with AlGaAs getter layer 190 is shown in FIG. 7 showing an Al-profile 780 of a VCSEL-structure according to a first embodiment. The structure has a slow increase and decrease of the Al-content between the lower and the upper Al-level over 200 nm at around 8000 nm. The increase is much slower than in the DBR-stacks.

Figure 8:
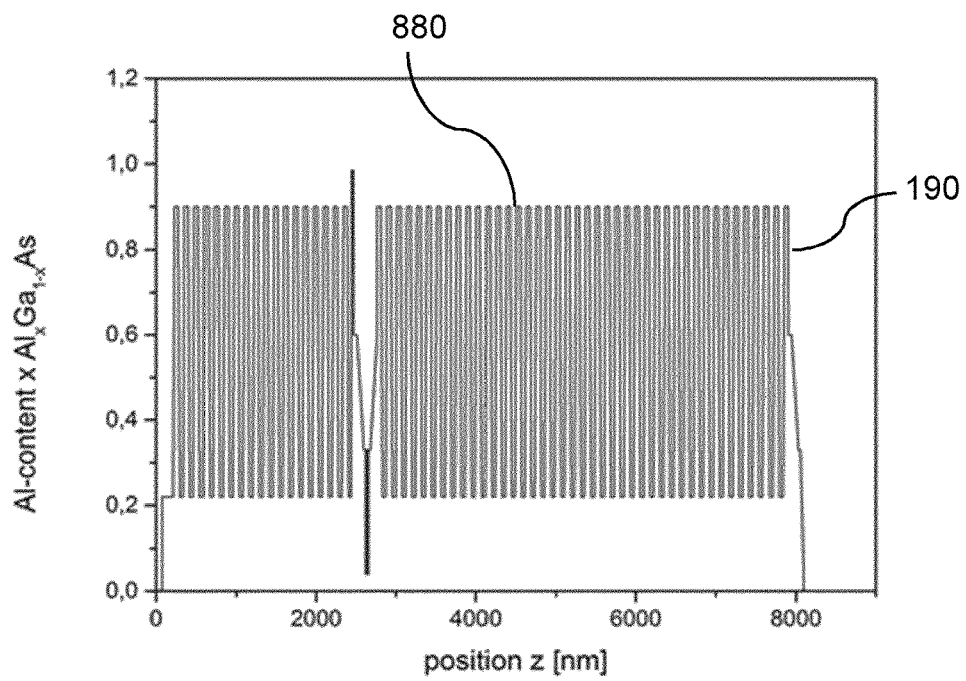

Another example is shown in FIG. 8 showing an Al-profile 880 of a VCSEL-structure according to a second embodiment. In this case, a structure with the slowly varying Al content is grown at around 8000 nm. In the examples of FIGS. 7 and 8 such AlGaAs getter layer 190 is only repeated once. It is of course possible to grow two or more of these AlGaAs getter layers 190 optionally adjacent to each other to improve the incorporation of the impurity like S or other impurities by changing growth conditions in comparison to the growth conditions of the layers of the light emitting layer structure 155 comprising Aluminum. The growth conditions are chosen out of the group Arsenic partial pressure, Oxygen partial pressure, deposition temperature, total deposition pressure and deposition rate of Aluminum.

Figure 9:
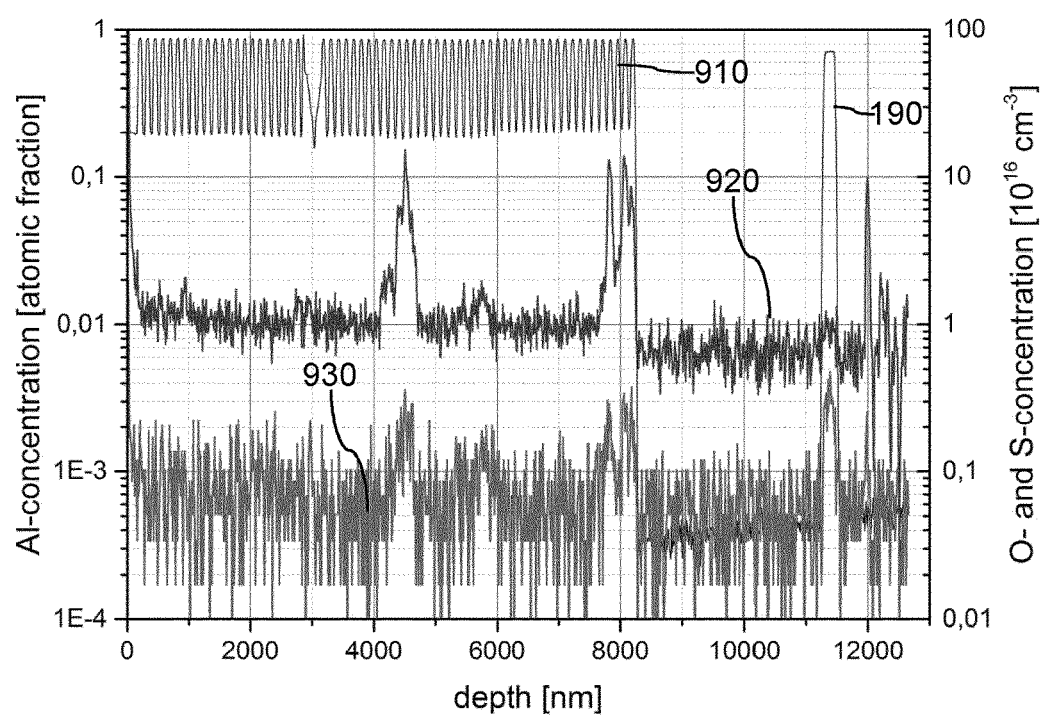

FIG. 9 shows an Aluminum concentration 910, a Sulfur concentration 930 and an Oxygen concentration 920 of a light emitting semiconductor device 100 with varying Oxygen partial pressure during deposition of the layers of the light emitting semiconductor device 100. Sulfur is predominantly embedded at increased oxygen partial pressure which is indicated by the peaks in the Oxygen concentration at around 8000 nm and 4500 nm. Increased Oxygen partial pressure may thus be used to trap impurities within one or more AlGaAs getter layer 190. This additional measure supports in this case the AlGaAs getter layer 190 which is shown at the right side of FIG. 9.

Figure 10:
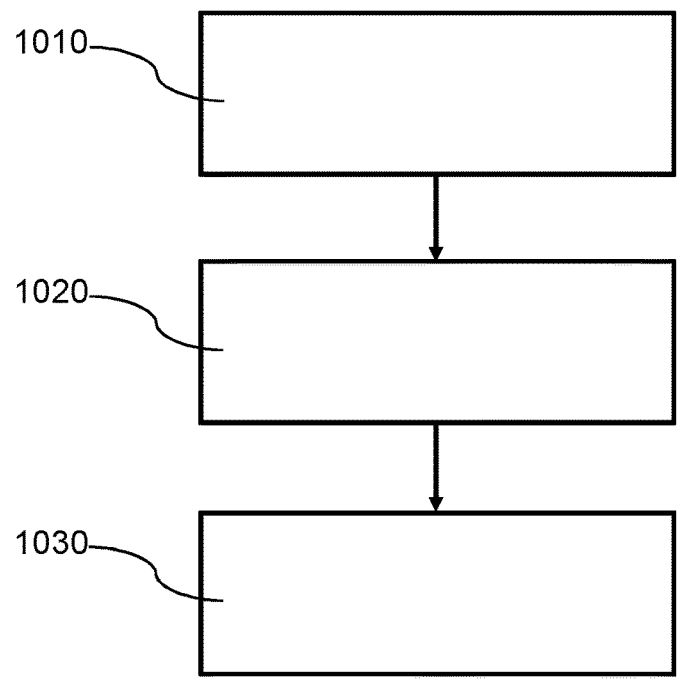

FIG. 10 shows a principal sketch of the method of manufacturing a light emitting semiconductor according to the present invention. In step 1010 a substrate 120 is provided. In step 1020 a light emitting layer structure 155 is provided at first growth conditions. In step 1030 a AlGaAs getter layer 190 is provided between the substrate 120 and the light emitting layer structure 155 for reducing impurities in the layer structure of the light emitting semiconductor device 155 at second growth conditions different from the first growth conditions. The second growth conditions are chosen such that a first concentration of the impurity within the AlGaAs getter layer 190 is at least 50% higher in comparison to a second concentration of the impurity in the layers of the light emitting layer structure 155 comprising Aluminum. The first and the second growth conditions are chosen out of the group Arsenic partial pressure, Oxygen partial pressure, deposition temperature, total deposition pressure and deposition rate of Aluminum.

FIG. 11 shows the effect of reducing the S concentration in the light emitting layer structure 155 of the light emitting semiconductor device 100. The lifetime of light emitting semiconductor devices 100 was measured by means of accelerated lifetime tests at 170° C. and a driving current of 6 mA. The lifetime test shows that the lifetime of the light emitting semiconductor devices 100 in which the maximum Sulfur concentration within the light emitting layer structure 155 was reduced by means of the AlGaAs getter layer 190 is increased to more than 1000 hours or even 1500 in comparison to a light emitting semiconductor device 100 with a lifetime of around 400 hours without AlGaAs getter layer 190.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS

100 light emitting semiconductor device
110 first electrode
120 substrate
130 bottom DBR
140 active layer
150 confinement layer
155 light emitting layer structure
160 top DBR
170 second electrode
190 AlGaAs getter layer
380 Al-profile of a prior art VCSEL-structure
430 Sulfur profile
450 Al-profile
780 Al-profile of a VCSEL-structure according to a first embodiment
880 Al-profile of a VCSEL-structure according to a second embodiment
910 Al-concentration
920 O-concentration
930 S-concentration
1010 step of providing a substrate
1020 step of providing a light emitting layer structure
1030 step of providing an AlGaAs getter layer

The invention claimed is:

1. A light emitting semiconductor device comprising:
   a substrate,
   a light emitting layer structure including a first impurity, and
   an AlGaAs getter layer for reducing the first impurity in the light emitting layer structure, the AlGaAs getting layer including a second impurity, the light emitting layer structure comprising:
   an active layer, and
   layers of varying Aluminum content,
      wherein a first concentration of the second impurity within the AlGaAs getter layer is at least 50% higher than a second concentration of the first impurity in the layers of the light emitting layer structure comprising Aluminum, and
      wherein the AlGaAs getter layer comprises a sublayer that contains Aluminum, and an Aluminum content of the Aluminum in the sublayer varies with less than 0.5%/nm between a first Aluminum content and a second Aluminum content.

2. The light emitting semiconductor device according to claim 1, wherein the second impurity incorporated in the AlGaAs getter layer is Sulfur.

3. The light emitting semiconductor device according to claim 1, wherein the AlGaAs getter layer is located between the substrate and the active layer.

4. The light emitting semiconductor device according to claim 1, wherein the AlGaAs getter layer comprises sublayers with increasing and decreasing Aluminum content.

5. The light emitting semiconductor device according to claim 1, wherein an Aluminum content of the layers of the light emitting layer structure comprising Aluminum varies with at least 0.5%/nm.

6. The light emitting semiconductor device according to claim 1, wherein the AlGaAs getter layer comprises a first concentration of Oxygen which is at least 50% higher than a second concentration of Oxygen in the layers of the light emitting layer structure comprising Aluminum.

7. The light emitting semiconductor device according to claim 1, wherein the thickness of the AlGaAs getter layer is at least 50 nm.

8. The light emitting semiconductor device according to claim 1, wherein the light emitting semiconductor device is a Vertical Cavity Surface Emitting Laser (VCSEL) comprising
   a first electrode, and
   a second electrode,
      wherein the light emitting structure comprises:
      a bottom distributed Bragg reflector (DBR),
      the active layer, and
      a top DBR,
      wherein an Aluminum content of the AlGaAs getter layer is configured to vary at least five times slower than an Aluminum content of a layer of the bottom DBR or the top DBR is configured to vary.

9. The light emitting semiconductor device according to claim 1, wherein the light emitting semiconductor device comprising two or more of the AlGaAs getter layer.

10. The light emitting semiconductor device according to claim 9, wherein the two or more of the AlGaAs getter layer are adjacent to each other.

11. The light emitting semiconductor device according to claim 1, wherein a concentration of the first or second impurity is below a defined threshold value.

12. A method of manufacturing a light emitting semiconductor device, the method comprising:
  developing a light emitting layer structure using first growth conditions on a substrate; and
  forming an AlGaAs getter layer for reducing a first purity in the light emitting layer structure using second growth conditions,
  wherein the second growth conditions are selected such that the light emitting, layer structure includes the first impurity and the AlGaAs getter layer includes a second impurity and that a first concentration of the second impurity within the AlGaAs getter layer is at least 50% higher than a second concentration of the first impurity in the layers of the light emitting layer structure comprising Aluminum, and the first and the second growth conditions are selected from the group consisting of Arsenic partial pressure, Oxygen partial pressure, deposition temperature, total deposition pressure and deposition rate of Aluminum, and
  wherein the deposition rate of Aluminum of the AlGaAs getter layer is selected such that the AlGaAs getter layer comprises a sublayer that contains Aluminum, and that an Aluminum content of the Aluminum in the sublayer varies with less than 0.5%/nm between a first Aluminum content and a second Aluminum content.

13. The method according to claim 12, wherein an Arsenic partial pressure during deposition of the AlGaAs getter layer is varied between 2 and 200 times a Gallium partial pressure.

14. The method according to claim 12, further forming at least a second AlGaAs getter layer for reducing impurities in the light emitting layer structure using second growth conditions.

15. The method according to claim 14, wherein at least the second AlGaAs getter layer and the AlGaAs getter layer are adjacent to each other.

16. The method according to claim 12, wherein adding the AlGaAs getter layer to the light emitting semiconductor device is performed after adding a dopant to a previously deposited layer.

17. The method according to claim 12, wherein a concentration of the first or second impurity is below a defined threshold value.

* * * * *